(12) United States Patent
Quinlan et al.

(10) Patent No.: US 6,486,450 B1
(45) Date of Patent: Nov. 26, 2002

(54) METHOD AND APPARATUS FOR INDUCING LOCALLY ELEVATED TEMPERATURES IN AN APPLICATION SPECIFIC INTEGRATED CIRCUIT

(75) Inventors: Una Quinlan, Dublin; Vincent Gavin, Galway; Tadhg Creedon, Furbo, all of (IE)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/662,114

(22) Filed: Sep. 14, 2000

(30) Foreign Application Priority Data

May 24, 2000 (GB) .............................................. 0012416

(51) Int. Cl.⁷ ............................ H05B 1/02; G11C 29/00
(52) U.S. Cl. ....................................... 219/494; 714/718
(58) Field of Search ................................. 219/476, 477, 219/479, 480, 482, 483, 490, 494, 209, 537, 538, 539; 714/734, 737, 718, 719, 723, 1, 2; 324/512

(56) References Cited

U.S. PATENT DOCUMENTS

| | | | |
|---|---|---|---|
| 4,222,514 A | * 9/1980 | Bass | 714/739 |
| RE31,828 E | * 2/1985 | Raymond et al. | 714/734 |
| 4,516,201 A | * 5/1985 | Warren et al. | 709/234 |
| 4,730,160 A | 3/1988 | Lipp | |
| 4,902,877 A | * 2/1990 | Grasso et al. | 219/483 |
| 5,309,090 A | 5/1994 | Lipp | |
| 5,473,259 A | 12/1995 | Takeda | |
| 5,673,028 A | * 9/1997 | Levy | 116/209 |
| 5,937,032 A | * 8/1999 | Nummelin et al. | 379/10 |
| 5,956,350 A | * 9/1999 | Irrinki et al. | 714/718 |
| 6,114,674 A | * 9/2000 | Baugh et al. | 219/209 |

OTHER PUBLICATIONS

IBM Technical Disclosure Bulletin, vol. 14, No. 6, Nov. 1971, Rielly et al., "Self Contained Chip Heater", page 1770.
IBM Technical Disclosure Bulletin, vol. 25, No. 7B, Dec. 1982, Yu, "Self–Heating Test Chip. . . ", page 3651.

* cited by examiner

Primary Examiner—Sang Paik
(74) Attorney, Agent, or Firm—Nixon & Vanderhye PC

(57) ABSTRACT

An application specific integrated circuit includes a multiplicity of operative circuit blocks. Disposed in at least one of the blocks is a multiplicity of selectively operative heater modules for providing localised heating within the block. The heater modules may comprise cyclic redundancy code generators each coupled to respond to a system clock, and each heater module may include a system clock divider providing a multiplicity of differently divided clock signals and means for selecting a clock signal for use by the module. The invention is useful in design variable testing to produce variation with temperature of the frequency of an intermittent timing error.

4 Claims, 5 Drawing Sheets

METHOD AND APPARATUS FOR INDUCING LOCALLY ELEVATED TEMPERATURES IN AN APPLICATION SPECIFIC INTEGRATED CIRCUIT

FIELD OF THE INVENTION

This invention relates to the design and testing of integrated circuits particularly large scale, application specific integrated circuits such as may be employed, for example, in high speed switching devices adapted to receive and transmit addressed data packets.

BACKGROUND OF THE INVENTION

The design and layout of such integrated circuits ('chips') for use in the processing of digital signals is lengthy and complex. An important stage in the process from design to manufacture is a 'de-bugging' stage for the identification and correction of faults which need not necessarily arise from the high level design but which may arise owing to the infringements of limits on set up and hold times or other physical-level problems. Examples include paths with strict timing tolerance or 'critical' paths within ASICs. In such examples small process variations or inaccuracies in simulation may produce intermittent faults.

When intermittent faults are identified in an ASIC during design verification testing it can be very difficult to isolate the faults to a specific block in the circuit. It is known to provide monitoring connections, usually called visibility buses, from internal nodes at key places in the data path but it is not always possible to select the correct paths to bring out the visibility buses to externally accessible pins.

One approach to the analysis of intermittent faults is to investigate temperature/voltage sensitivity, which can identify timing-related problems which may occur too sporadically or intermittently for certain identification of the location and cause of the fault. Generally such faults will increase in frequency as the local temperature increases. Heat guns, freezer spray or environmental changes have been proposed to vary the temperature but it is difficult to produce sufficiently specific local heating to obtain useful assistance in the isolation of faults.

SUMMARY OF THE INVENTION

The present invention envisages additional features within the ASIC to assist in the discovery of faults. The invention is based on the provision of power hungry modules, for example CRC (cyclic redundancy code) generators at various places on the chip and the individual enabling of such modules under selective control, for example by means of a CPU. Such modules may be inserted during the final placement of blocks in an ASIC technology using any one of the many computerised floor planning tools which are commercially available.

During design verification testing various heater modules could be enabled while running stress tests in order to identify potential design weaknesses as early as possible in the development stage. If intermittent faults do occur, these modules may be selectively enabled in different stages of the data path to help indicate regions on which attention may be focused.

Further features of the invention will be apparent from the accompanying drawings.

DETAILED DESCRIPTION

Figure 1:
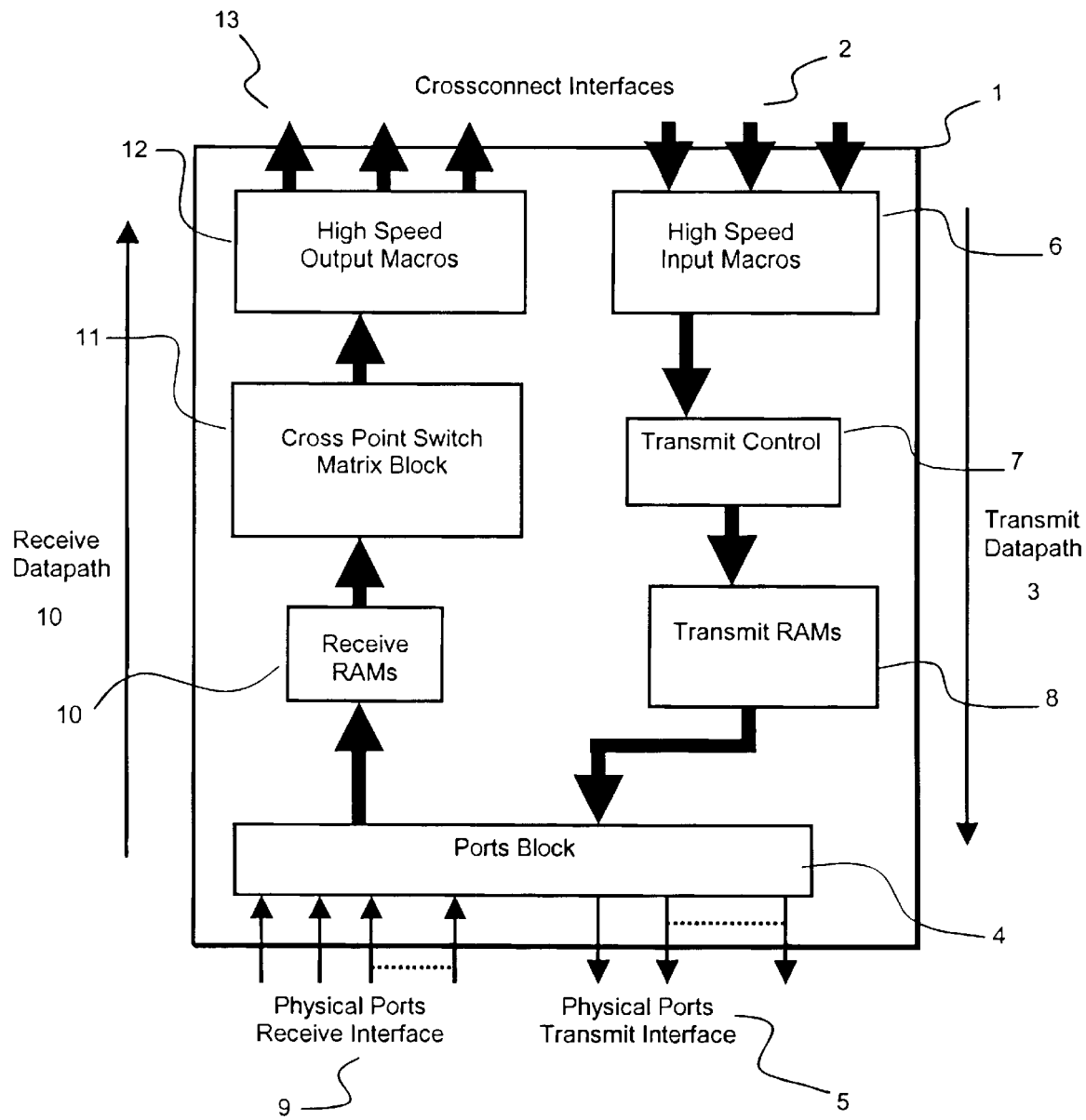
FIG. 1 is a general schematic illustration of a chip carrying an application specific integrated circuit.

FIG. 1 illustrates a typical chip 1 carrying an application specific integrated circuit intended for use as part of a high-speed network switch for use in a packet-based data communication network. It is presumed in this example that chip 1 is one of a multiplicity of chips constituting the operative circuits of the switch and each chip has connections both to external physical ports and to other chips within the same network switch. Thus the chip 1 has a set of terminal pins 2 which will be connected to cross-connect interfaces and which receive from other chips signals intended for propagation in a transmit data path indicated schematically by the arrow 3 to a ports block 4 connected to physical ports by way of a transmit interface 5. More specifically the transmit data path 3 may be constituted by high-speed input macros. The input macros 6 are coupled by way of a transmit control 7 to transmit RAMs 8 coupled to the ports block 4. Although the specific architecture of the switch and therefore the chip 1 is not of importance to the present invention, the 'transmit control' will typically receive by way of the input macros signals enabling the placement of data packets, transmitted across the cross-connect interfaces, in a multiplicity of transmit queues allotted to the various ports from which the switch can forward packets.

Conversely, the ports block 4 is also coupled to a receive interface 9 connected to the various ports of the switch in order to receive packets arriving at those ports (which are preferably capable of duplex working). Packets from the ports block 4 will be directed along a receive data path 10 to the cross connect interfaces. More particularly, packets received at the ports block 9 from the receive interface will be directed to receive queues defined within the receive RAMs 10. From there at appropriate times packets will be switched by means of a cross point switch matrix block 11 to respective channels defined in high speed output macros 12 from whence they will be directed by way of pins 13 to the cross-connect interfaces.

FIG. 1 is intended to show in slightly simplified form a schematic block diagram of an ASIC.

Figure 2:
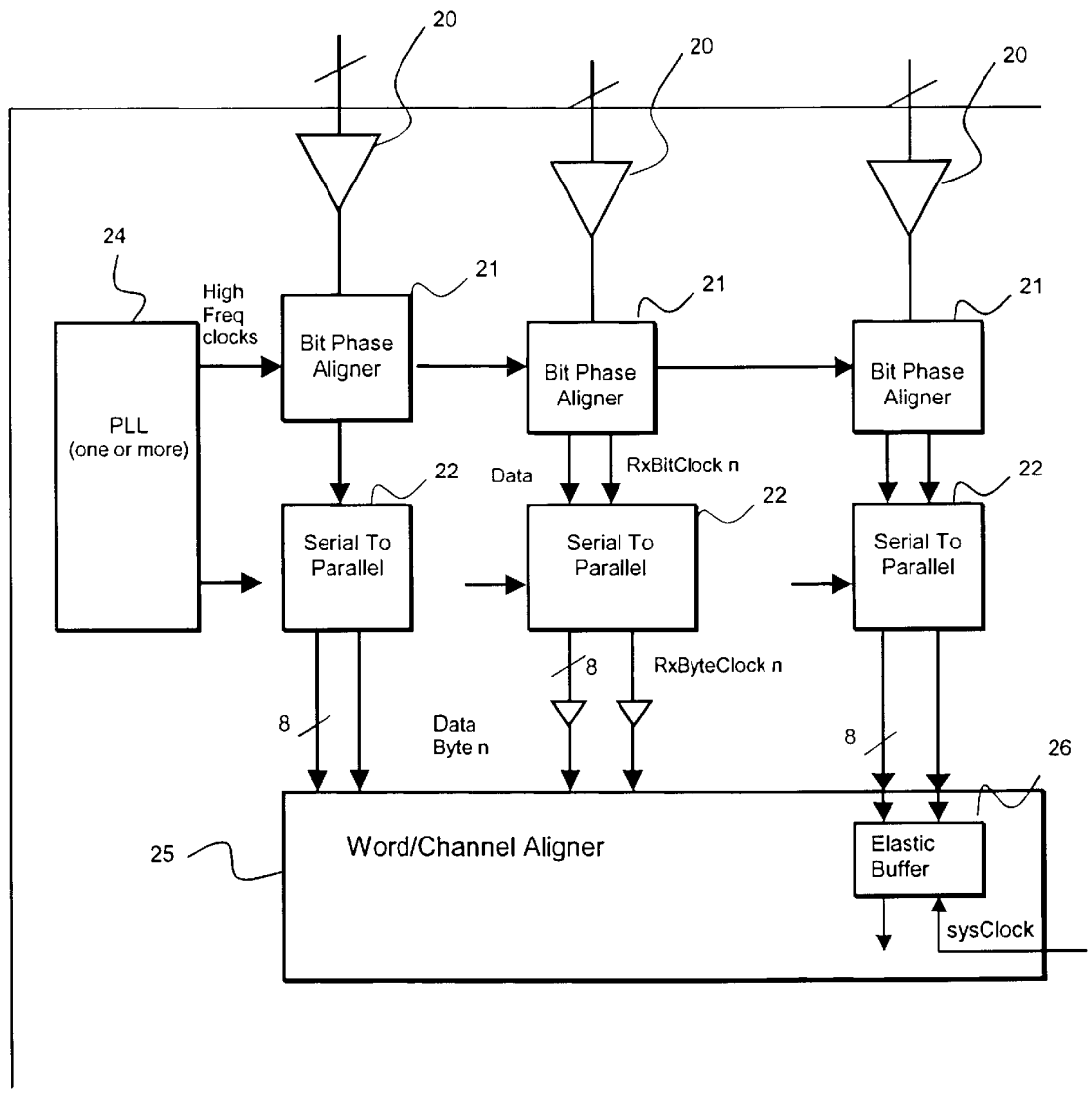
FIG. 2 is a schematic diagram of part of the ASIC shown in FIG. 1.

FIG. 2 is a more specific illustration of the 'cross-connect input data path' which may have a large number of very high-speed blocks, many clock domains and sensitive design interfaces.

This part of the ASIC may typically consist of input differential amplifiers 20 which receive serial digital streams and couple them to respective bit phase aligners 21 coupled to serial to parallel converters 22. The bit phase aligners and serial to parallel converters may all be under the control of phase locked loop circuits 24. The serial to parallel converters couple byte-wide data and a received byte clock to a word/channel aligner 25 which includes an 'elastic' buffer 26 for each channel. Words are written into the elastic buffer at the rate determined by a respective recovered clock whereas data is read out from all the elastic buffers using common local 'system' clock. There are therefore a multiplicity of clock domains, producing complex channel-alignment and timing difficulties.

It is in regions such as shown in FIG. 2 that intermittent faults arising from infringement of permitted timing ranges can most frequently occur.

In the layout of a chip such as shown in FIGS. 1 and 2 one may develop a strategy for placement of power-hungry modules which are disposed adjacent high-speed elements but not in the data paths. One suitable module for this purpose is a cyclic redundancy code (CRC) generator. In order to dispose the CRC generator within the integrated circuit it is desirable to develop a 'hard' macro representing the generator and the necessary associated control, as described with reference to the remaining figures and to modify the layout algorithm for the application specific integrated circuit so that such modules are physically disposed near selected blocks in the ASIC. These selected blocks may include the phase-locked loops 24, the high-speed speed input and output macros 20 and the word aligner 25.

Figure 6:
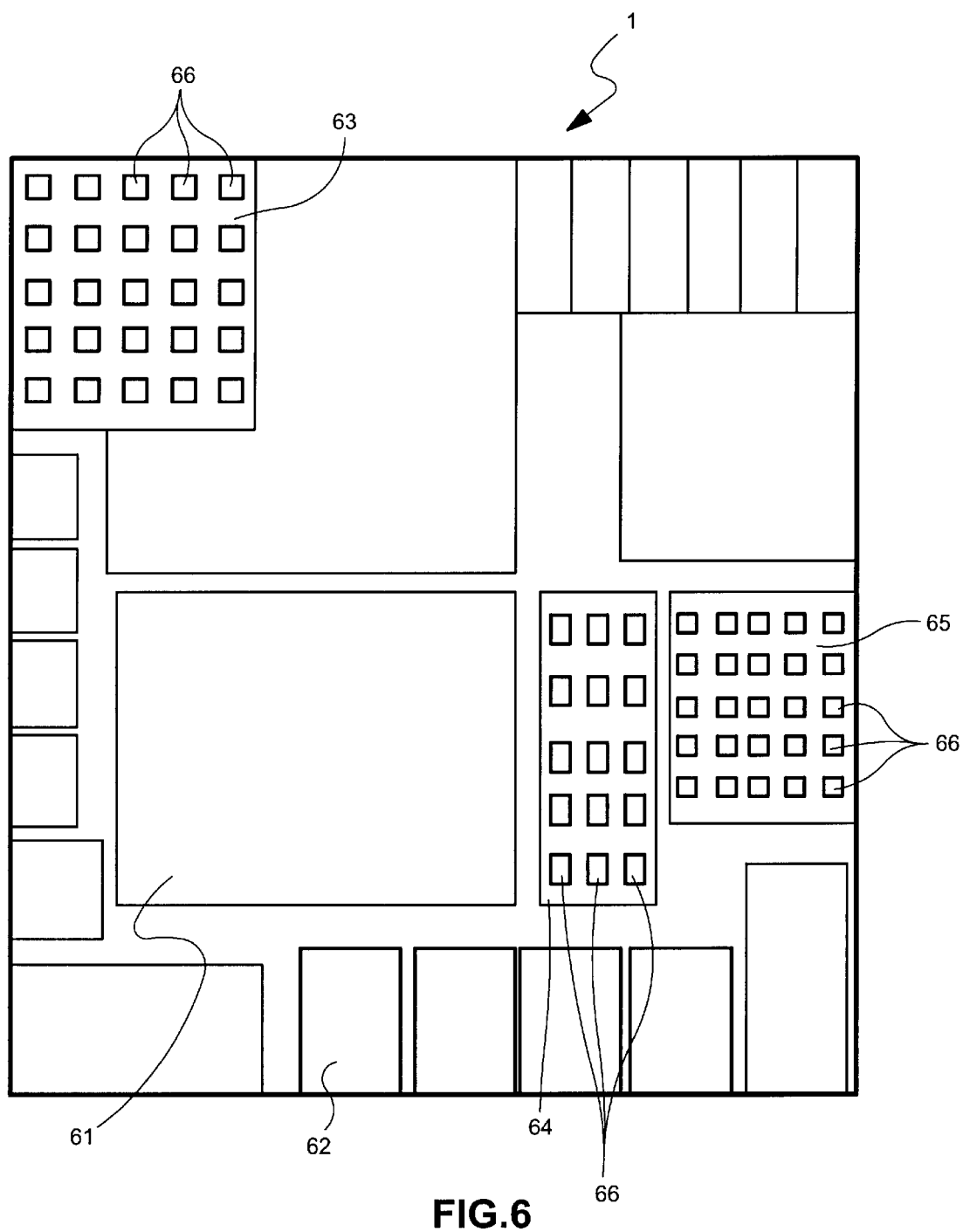
FIG. 6 illustrates the layout of the chip of FIG. 1 having a variety of large and small cells.

FIG. 6 illustrates (in a simplified manner) a 'floor plan' of a large scale integrated circuit notionally corresponding to the schematic FIG. 1. It generally consists of sub-cells of which some may be 'hard' or predetermined, in that they have to conform in function and implementation to existing designs. Others are 'soft' in that their layout and implementation may be variable. Their layout and routing are typically determined in a single process along with the 'hard' sub-cells or macros. In general it is desirable to place logic blocks which have strict or critical tolerances of operating times close together, to shorten the delay caused by their interconnections. In 'deep sub-micron' designs delays along connecting tracks may exceed the delays in the cells (such as NAND gates etc).

FIG. 6 illustrates the chip 1 with a variety of relatively large cells (e.g. sub-cell 61) and relatively small cells (e.g. sub-cell 62) laid out. The ASIC includes three blocks 63, 64 and 65 wherein, the timing constraints on signals are strict and therefore wherein faults are likely to occur and may be more readily located using localised heating. These regions have, either scattered or in a regular array as shown, 'heater' modules 66 disposed therein, preferably adjacent but not operationally connected to data paths.

Figure 3:
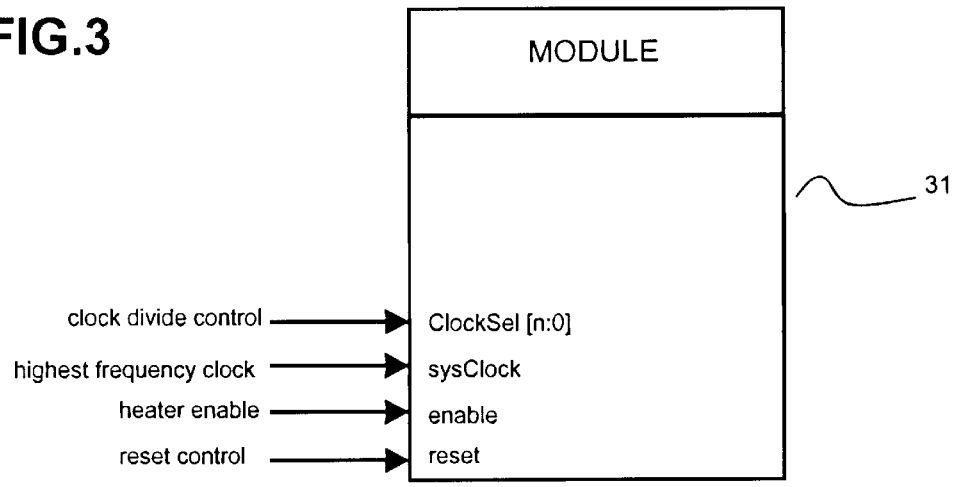
FIG. 3 is an illustration of a module of the kind proposed for use in the present invention.

FIG. 3 is a schematic block diagram of a module 31 according to the invention. It is self-contained in that it will not affect the data path and is provided merely to act as a heat generator. Preferably it receives four signals, the highest frequency clock available in the chip, a clock divider control, an enable signal and a reset signal. When enabled it will operate as a CRC generator at a frequency determined by the division ratio applied to the clock. The variation of the division ratio gives some control over the heating effect.

Figure 4:
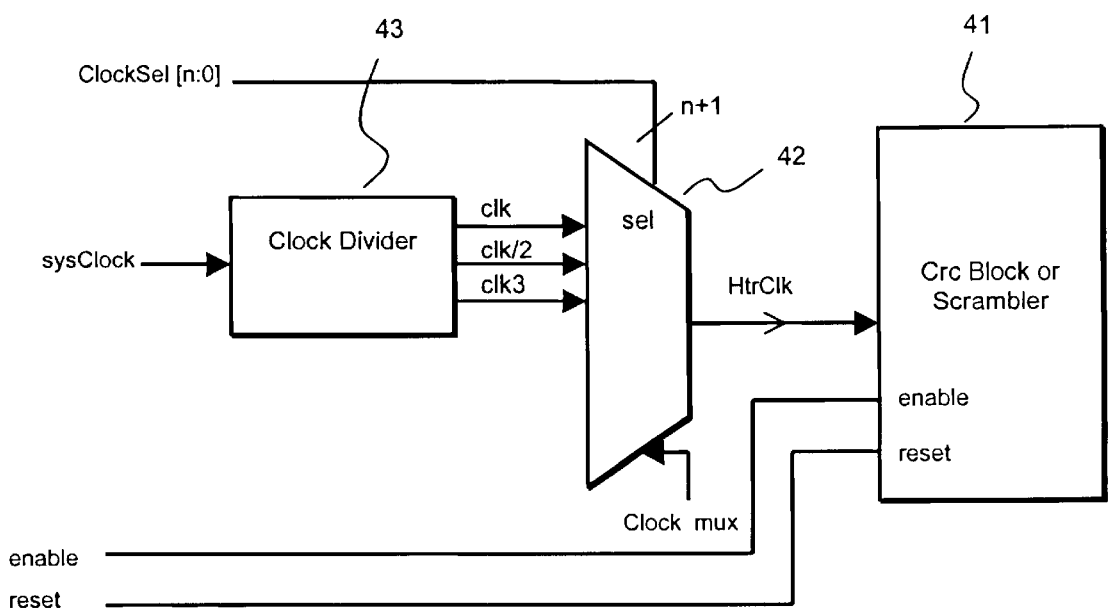
FIG. 4 is a schematic diagram illustrating the local control of a module such as shown in FIG. 3.

FIG. 4 is a more specific schematic diagram of the module shown in FIG. 3. It comprises a cyclic redundancy code generator or scrambler 41, which receives the enable and reset signals and a selected clock signal by way of a selector 42 which receives a clock select signal enabling the selection of one or other of the divided clocks output from a clock divider 43 receiving the system clock.

Figure 5:
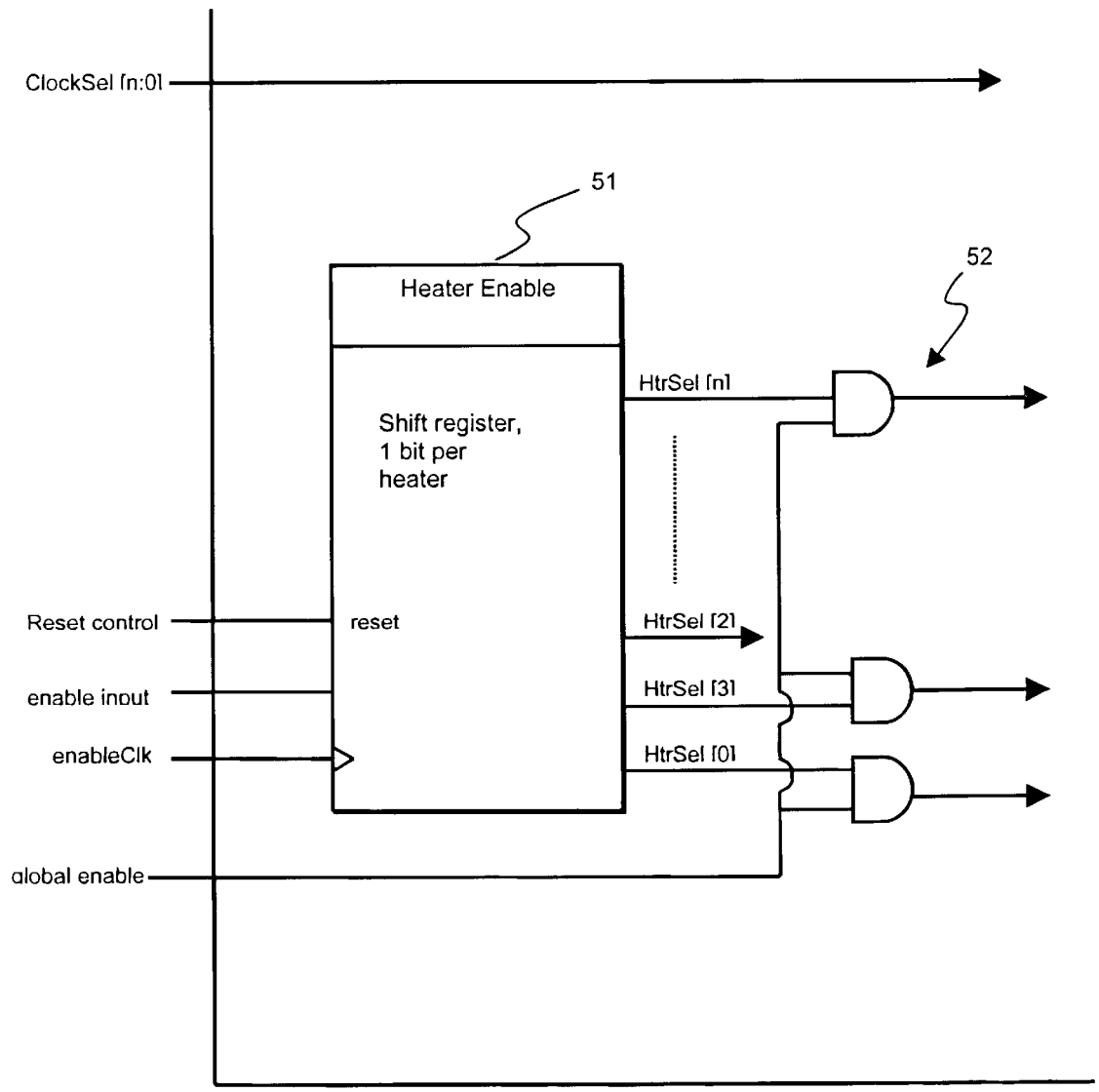
FIG. 5 illustrates an enabling circuit for the module shown in FIGS. 3 and 4.

FIG. 5 illustrates an enabling circuit consisting of an enable block 51 which receives a reset control, an enable input, and an enable clock. It essentially consist of a shift register with one bit for every module that it controls. The select outputs are coupled to a respective one of a set of AND gates 52, one for each of the modules and coupled to receive a common enable signal.

The enable block 51 is preferably under CPU control and is intended to be operated in a pre-determined sequence by way of the CPU. One suitable sequence would be as follows:

(a) The reset control may be cleared to zero and the common enable input would also be cleared to zero.

(b) The enable input would be set up for a specific 'heater' (n). Then the enable clock would be pulsed from zero to one and back to zero. This would be repeated for each heater.

(c) This would be repeated for all enabled 'heaters' and then the global enable would be driven to one.

This mechanism allows a multiplicity of 'heaters' to be enabled at any time; the selection depends on the strategy for isolating faults and testing temperature gradient.

What is claimed is:

1. An application specific integrated circuit including a multiplicity of operative circuit blocks, a multiplicity of data paths extending through and between said blocks; and for at least one of said blocks, a multiplicity of selectively operable electronic heater modules disposed within the said one block, being physically disposed within the block but operationally separate from said data paths, each of said heater modules being selectively operative to provide localised heating for use in detecting temperature-sensitive intermittent failures within said one block.

2. An application specific integrated circuit according to claim 1 wherein each heater module comprises a self-contained cyclic redundancy code generator physically adjacent but not operationally connected to data paths.

3. An application specific integrated circuit according to claim 2 wherein each heater module includes a system clock divider providing a multiplicity of differently divided clock signals and means for selecting a clock signal for use by the respective heater module.

4. A method of testing an application specific integrated circuit including a multiplicity of operational circuit blocks, at least one block containing a multiplicity of data paths and a multiplicity of physically separated CRC generators, each of which is disposed adjacent a respective data path and is operationally separate from any of the data paths, the method comprising:

selectively enabling each of said CRC generators to provide selective localised heating within said at least one block; and detecting a variation in the frequency of at least one temperature-sensitive fault in said circuit.

* * * * *